(12) United States Patent
Taniguchi et al.

(10) Patent No.: US 12,384,096 B2
(45) Date of Patent: Aug. 12, 2025

(54) ATTACHED BODY PRODUCTION METHOD, ATTACHED BODY, AND MICROSTRUCTURE FORMATION METHOD

(71) Applicant: SCIVAX CORPORATION, Kanagawa (JP)

(72) Inventors: Yutaka Taniguchi, Kanagawa (JP); Satoru Tanaka, Kanagawa (JP)

(73) Assignee: Scivax Corporation, Kanagawa (JP)

( * ) Notice: Subject to any disclaimer, the term of this patent is extended or adjusted under 35 U.S.C. 154(b) by 690 days.

(21) Appl. No.: 17/616,713

(22) PCT Filed: Jun. 2, 2020

(86) PCT No.: PCT/JP2020/021727
§ 371 (c)(1),
(2) Date: Sep. 6, 2022

(87) PCT Pub. No.: WO2020/246457
PCT Pub. Date: Dec. 10, 2020

(65) Prior Publication Data
US 2023/0001629 A1  Jan. 5, 2023

(30) Foreign Application Priority Data
Jun. 5, 2019  (JP) .................. 2019-105755

(51) Int. Cl.
*B29C 59/00*   (2006.01)
*B29C 59/02*   (2006.01)

(52) U.S. Cl.
CPC ............ *B29C 59/002* (2013.01); *B29C 59/02* (2013.01)

(58) Field of Classification Search
CPC ............................. B29C 59/002; B29C 59/02
See application file for complete search history.

(56) References Cited

U.S. PATENT DOCUMENTS

| | | | |
|---|---|---|---|
| 2002/0132482 A1* | 9/2002 | Chou | B29C 43/003 438/692 |
| 2007/0164476 A1* | 7/2007 | Wu | G03F 7/0002 264/293 |
| 2009/0183831 A1* | 7/2009 | Wessels | G03F 7/0002 156/285 |

* cited by examiner

*Primary Examiner* — George R Koch
(74) *Attorney, Agent, or Firm* — Schroeder Intellectual Property Law Group, LLC

(57) ABSTRACT

An attached body production method having a sealing material disposing step for disposing a sealing material on a mold and/or a molded product so that a molded surface of the molded product is surrounded by the sealing material when the mold and the molded product are attached together; a pressure reduction step for reducing the pressure of the atmosphere around the mold and the molded product in a state where the mold and the molded product are separated from each other; a sealing step for putting the mold and the molded product on top of each other, and sealing a space between the mold 1 and the molded product with the sealing material; and a first pressure-application step for applying pressure with a fluid in a state where the space between the mold and the molded product is sealed, wherein the sealing material has fluidity in at least the sealing step, and is configured to attach to only one of the mold and the molded product when the molded product is released from the mold.

11 Claims, 5 Drawing Sheets

ATTACHED BODY PRODUCTION METHOD, ATTACHED BODY, AND MICROSTRUCTURE FORMATION METHOD

RELATED APPLICATIONS

The present application is a § 371 national phase application of International Patent Application No. PCT/JP2020/021727 filed Jun. 2, 2020, which claims the filing benefit of Japanese Patent Application No. 2019-105755, filed Jun. 5, 2019—the contents of both of which are incorporated herein by reference.

TECHNICAL FIELD

The present disclosure relates to an attached body production method, an attached body, and a microstructure formation method which have a feature such that attachment is performed with a gas that is present between a mold and an object subjected to pattern formation being eliminated.

BACKGROUND ART

In recent years, a nanoimprinting technology is getting an attention as a method of forming an ultra-micro pattern in a micro-order or in a nano-order. This is to depress a mold that has a micropattern against an object subjected to pattern formation like a resin, and to transfer such a pattern to the object subjected to pattern formation. Regarding this imprinting technology, in order to increase the transfer area, an imprinting apparatus that utilizes fluid pressure may be applied in some cases.

In the case of the imprinting apparatus that utilizes fluid pressure, a gas that is present between a mold and an object subjected to pattern formation may cause an uneven depress at the time of pattern transfer, and may cause a transfer failure. Hence, degassing means is provided which reduces the pressure around a mold and an object subjected to pattern formation, and which eliminates a gas between the mold and the object subjected to pattern formation (e.g., Patent Document 1).

CITATION LIST

Patent Literatures

[Patent Document 1] WO 2012/165310

SUMMARY OF INVENTION

Technical Problem

According to such an apparatus, however, since it is necessary to close a space between the mold and the object subjected to pattern formation by gas-tightly sealing means until a transfer completes so as not to allow a gas to be present between the mold and the object subjected to pattern formation, a single-object-by-single-object process is difficult.

Accordingly, an objective of the present disclosure is to provide an attached body production method, an attached body and a microstructure formation method which can achieve a state in which a gas between a mold and an object subjected to pattern formation is surely eliminated, and which can perform single-object-by-single-object process in an imprinting.

Solution to Problem

In order to accomplish the above objective, an attached body production method according to the present disclosure is a production method for an attached body of a mold and an object subjected to pattern formation, and the method includes:
- a sealing material placing step of placing a sealing material on either one of or both of the mold and the object subjected to pattern formation so as to surround a to-be-molded surface of the object subjected to pattern formation when the mold and the object subjected to pattern formation are attached to each other;
- a pressure reducing step of reducing an atmospheric pressure around the mold and the object subjected to pattern formation with the mold and the object subjected to pattern formation being separated from each other;
- a hermetic sealing step of causing the mold and the object subjected to pattern formation to be laid over with each other, and of gas-tightly sealing a space between the mold and the object subjected to pattern formation by the sealing material; and
- a first pressurizing step of pressurizing by fluid with the space between the mold and the object subjected to pattern formation being gas-tightly sealed,
- in which the sealing material is configured to have a fluidity in at least the hermetic sealing step, and to be adhered to only either one of the mold or the object subjected to pattern formation at a time of demolding between the mold and the object subjected to pattern formation.

In this case, the above attached body production method may further include, prior to the sealing material placing step, a first surface processing step of forming a first surface processed portion on either one of the mold or the object subjected to pattern formation, the first surface processed portion increasing adhesion strength with the sealing material. The first surface processed portion may be a primer that increases the adhesion strength between the sealing material and the mold or the object subjected to pattern formation. Moreover, the first surface processed portion may be a surface having undergone a plasma treatment or a corona treatment that increases the adhesion strength between the sealing material and the mold or the object subjected to pattern formation. Furthermore, the first surface processed portion may be formed by concavities and convexities that increase the adhesion strength between the sealing material and the mold or the object subjected to pattern formation.

The above attached body production method may further include, prior to the sealing material placing step, a second surface processing step of forming a second surface processed portion on either one of the mold or the object subjected to pattern formation, the second surface processed portion decreasing adhesion strength with the sealing material.

The sealing material may be formed of a material which is configured to be adhered to only the object subjected to pattern formation at the time of demolding between the mold and the object subjected to pattern formation, and which is removable by etching performed on the to-be-molded surface. Moreover, the sealing material may be a water-soluble resin. Furthermore, the sealing material may be formed of a material that decreases adhesion strength by emission of light thereto.

When the mold and the object subjected to pattern formation are made in parallel with each other, in the sealing material placing step, it is preferable that the placement should be performed in such a way that a distance obtained by subtracting a thickness of the sealing material from a distance between the mold and the object subjected to pattern formation at a location where the sealing material is placed becomes equal to or shorter than a distance between the mold and the to-be-molded surface of the object subjected to pattern formation.

Moreover, it is preferable that, in the first pressurizing step, the pressurization should be performed at an atmospheric pressure.

An attached body according to the present disclosure is an attachment body of a mold and an object subjected to pattern formation, the mold including a molding surface, the object subjected to pattern formation including a to-be-molded surface attached to the molding surface, and the attached body includes:

a sealing material that is adhered between the mold and the object subjected to pattern formation so as to surround the to-be-molded surface, in which the sealing material is configured to be adhered to only either one of the mold or the object subjected to pattern formation at a time of demolding between the mold and the object subjected to pattern formation.

In this case, it is preferable that either one of the mold or the object subjected to pattern formation should include a first surface processed portion that increases adhesion strength with the sealing material. The first surface processed portion may be a primer that increases the adhesion strength between the sealing material and the mold or the object subjected to pattern formation. Moreover, the first surface processed portion may be a surface having undergone a plasma treatment or a corona treatment that increases the adhesion strength between the sealing material and the mold or the object subjected to pattern formation. Furthermore, the first surface processed portion may be formed by concavities and convexities that increase the adhesion strength between the sealing material and the mold or the object subjected to pattern formation.

It is preferable that either one of the mold or the object subjected to pattern formation should include a second surface processed portion that decreases the adhesion strength with the sealing material.

The sealing material may be formed of a material which is configured to be adhered to only the object subjected to pattern formation at the time of demolding between the mold and the object subjected to pattern formation, and which is removable by etching performed on the to-be-molded surface. Moreover, the sealing material may be a water-soluble resin. Furthermore, the sealing material may be formed of a material that decreases adhesion strength by emission of light thereto.

A microstructure formation method according to the present disclosure is a microstructure formation method of forming a microstructure in an object subjected to pattern formation, and the microstructure formation method includes:

a demolding step of demolding the mold from the object subjected to pattern formation of the above-described attached body according to the present disclosure.

In this case, the above method may further include a second pressurizing step of pressurizing the attached body by fluid at a pressure that is greater than an atmospheric pressure.

Moreover, the above microstructure formation method may further include a light emitting step of emitting light to the attached body so as to cause the object subjected to pattern formation to be cured.

Furthermore, the above microstructure formation method may further include a sealing material removing step of removing the sealing material from the mold or the object subjected to pattern formation.

The sealing material removing step may be to remove from the object subjected to pattern formation by etching performed on the to-be-molded surface. Moreover, the sealing material removing step may be to dissolve the sealing material for the removal.

Advantageous Effects of Invention

According to the present disclosure, a state in which a gas between the mold and the object subjected to pattern formation is surely eliminated can be surely achieved using the sealing material.

DESCRIPTION OF EMBODIMENTS

Figure 1:
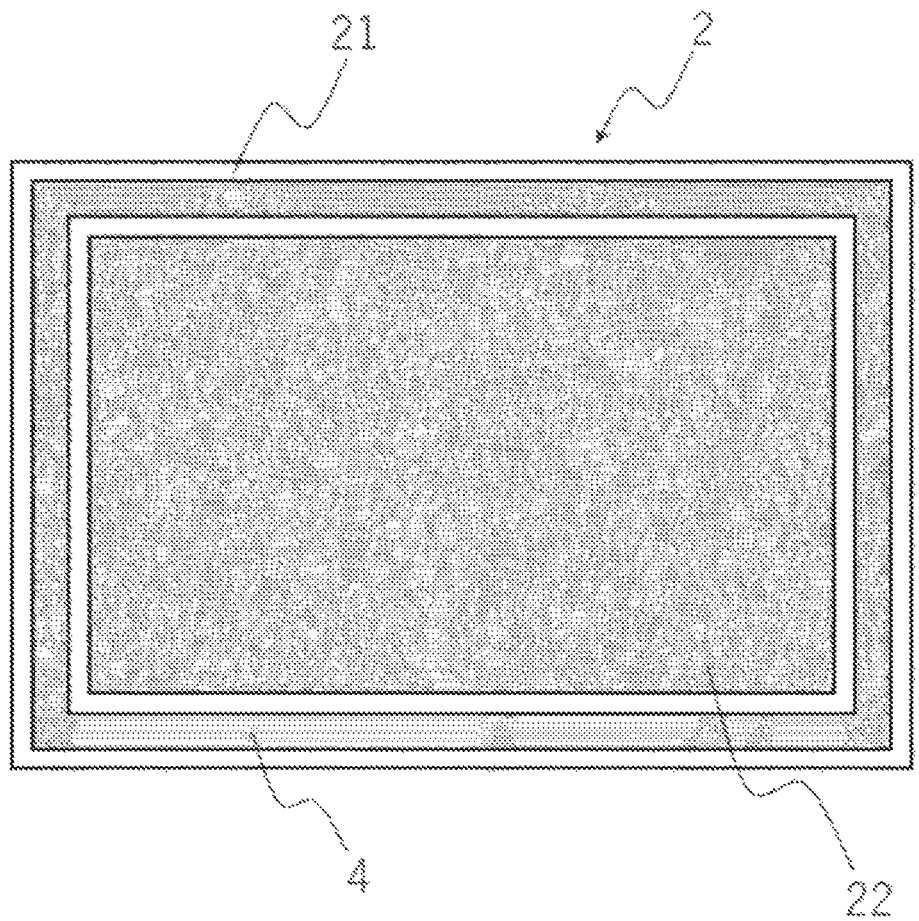
FIG. 1 is a plan view illustrating a sealing material and an object subjected to pattern formation according to the present disclosure.

An attached body production method according to the present disclosure will be described with reference to FIG. 1 to FIG. 9. The attached body production method according to the present disclosure is to produce an attached body of a mold 1 and an object 2 subjected to pattern formation, and mainly includes a sealing material placing step, a pressure reducing step, a hermetic sealing step, and a first pressurizing step.

Note that the mold 1 in this specification is formed of, for example, "metal like nickel", "ceramics", "carbon material like glasslike carbon", "silicon", etc., and has a predetermined pattern on one end surface (a molding surface 15). This pattern can be formed by performing a precise mechanical process on the molding surface 15. Moreover, it can be formed by performing semiconductor microfabrication technology like etching on a silicon substrate, etc., or by forming a meal plating by electroforming, e.g., nickel plating on the surface of such a silicon substrate, and by peeling the metal plating layer. Moreover, a resin-made mold produced by imprinting technology, etc., is also applicable. In this case, the mold 1 may be formed in a flexible film shape relative to a to-be-molded surface of the object 2 subjected to pattern formation. Needless to say, as far as a micropattern can be formed, the material of the mold 1 and the production method thereof are not limited to any particular ones.

Moreover, a molding pattern formed in the mold 1 includes not only a geometric shape with concavities and convexities, but also a pattern to transfer a predetermined surface condition like a transfer of a mirror-surface condition with a predetermined surface roughness, and a pattern to transfer an optical element like a lens with a predetermined curved surface. Furthermore, the molding pattern is formed in various sizes such that the width of a convexity and the minimum dimension of the width of the concavity in a planar direction are equal to or smaller than 100 µm, 10 µm, 2 µm, 1 µm, 100 nm, and 10 nm. Still further, the dimension in the depthwise direction is also formed in various sizes, such as equal to or greater than 10 nm, 100 nm, 200 nm, 500 nm, 1 µm, 10 µm, and 100 µm.

Furthermore, the object 2 subjected to pattern formation is not limited to any particular one as far as it has a to-be-molded surface 25 on which imprinting can be performed. Examples are a substrate 21 which is formed of resin, inorganic compound or metal, etc., and on which a layer 22 subjected to pattern formation in a film shape and having a fluidity is formed, one that is simply formed in a substrate shape, and a flexible film. Moreover, the layer 22 subjected to pattern formation with a fluidity may be formed on the mold 1, and the layer 22 subjected to pattern formation may be joined to the substrate 21 when the substrate 21 and the mold 1 are pressed against each other. Furthermore, the object 2 subjected to pattern formation is not limited to a planar shape, and may include the surface subjected to pattern formation that is a curved surface like a lens.

Example materials of the object 2 subjected to pattern formation applicable are a photo-curing resin, a thermosetting resin, and a thermoplastic resin.

Example photo-curing resin or thermosetting resin applicable is unsaturated hydrocarbon group containing compounds of vinyl group and allyl group, such as epoxide containing compounds, (metha) acrylic ester compounds, vinyl-ether compounds, and bis-allylnadic imide compounds. In this case, polymerization reactive group containing compounds for thermal polymerization may be utilized in solo, or a thermal reactive initiator in order to improve the thermosetting property may be added for utilization. Furthermore, a photoreactive initiator may be added, and the polymerization reaction may be progressed by emission of light to form a molding pattern. Suitably applicable example thermal reactive radical initiators are organic peroxide and azo compounds, and suitably applicable example photoreactive radial initiators are acetophenone derivative, benzophenone derivative, benzoin-ether derivative, and xanthone derivative, etc. Moreover, the reactive monomer may be utilized without a solvent, or may be dissolved in a solvent, and may be subjected to desolvation after applied for utilization.

Furthermore, example thermoplastic resins are cyclic-olefin-based resins, such as cyclic-olefin ring-opening polymerization/hydrogenation material (COP) and cyclic-olefin copolymer (COC), acrylic resin, polycarbonate, vinyl-ether resin, fluorine resin, such as perfluoro-alkoxy-alkane (PFA) and polytetrafluoroethylene (PTFE), polystyrene, polyimide-based resin, and polyester-based resin, etc.

Figure 2:
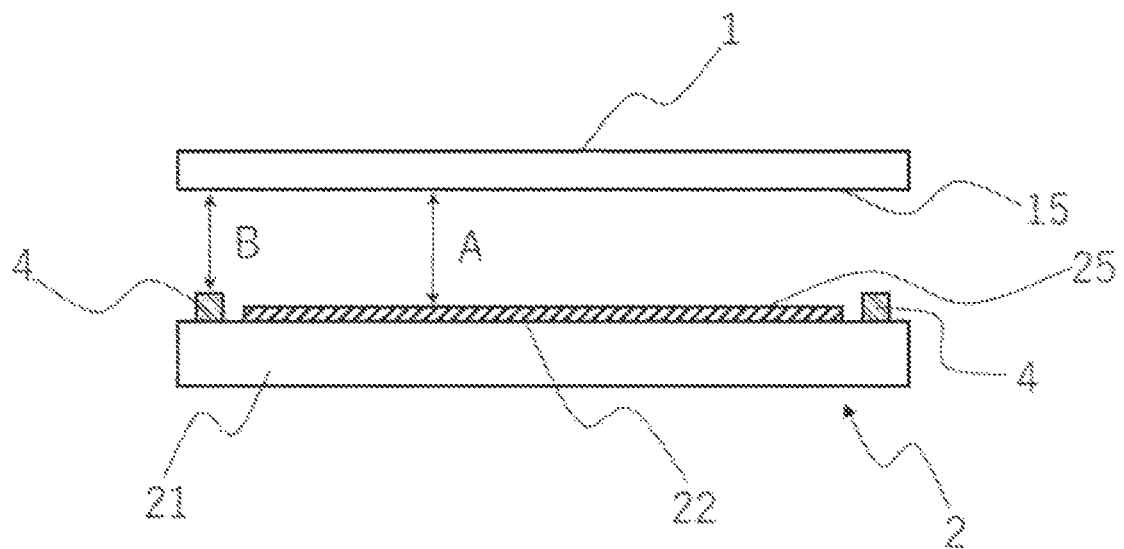
FIG. 2 is a partial end surface diagram illustrating a sealing material placing step according to the present disclosure.
Figure 3:
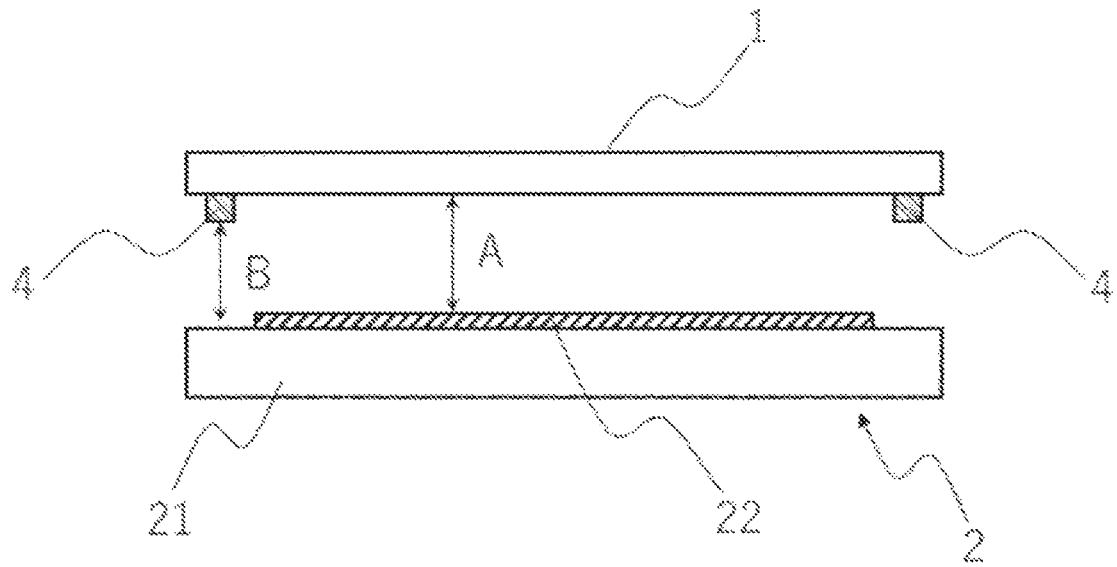
FIG. 3 is a partial end surface diagram illustrating another sealing material placing step according to the present disclosure.
Figure 4:
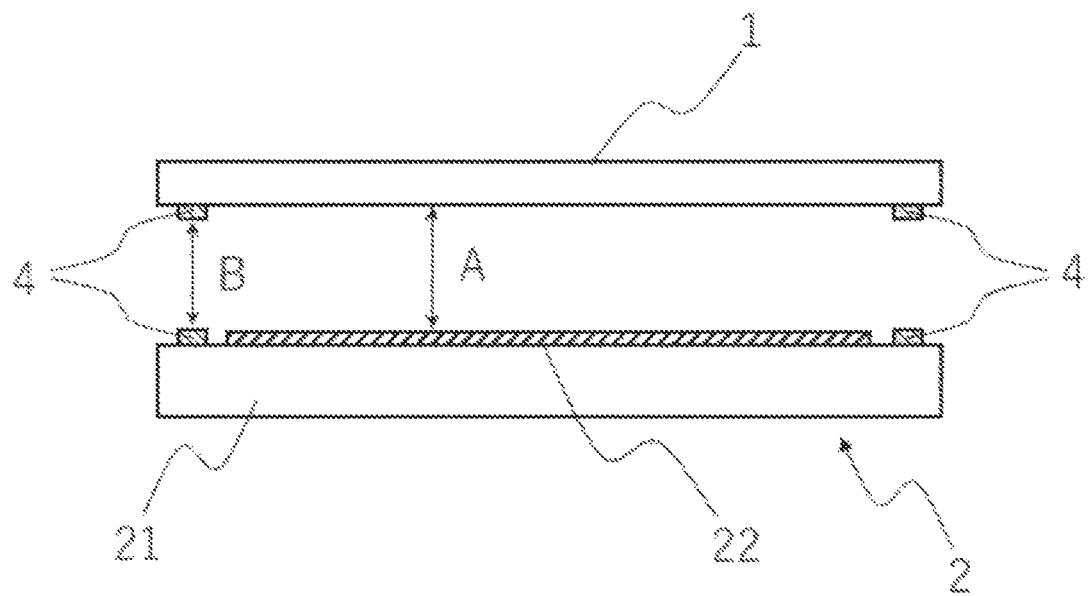
FIG. 4 is a partial end surface diagram illustrating another sealing material placing step according to the present disclosure.
Figure 5:
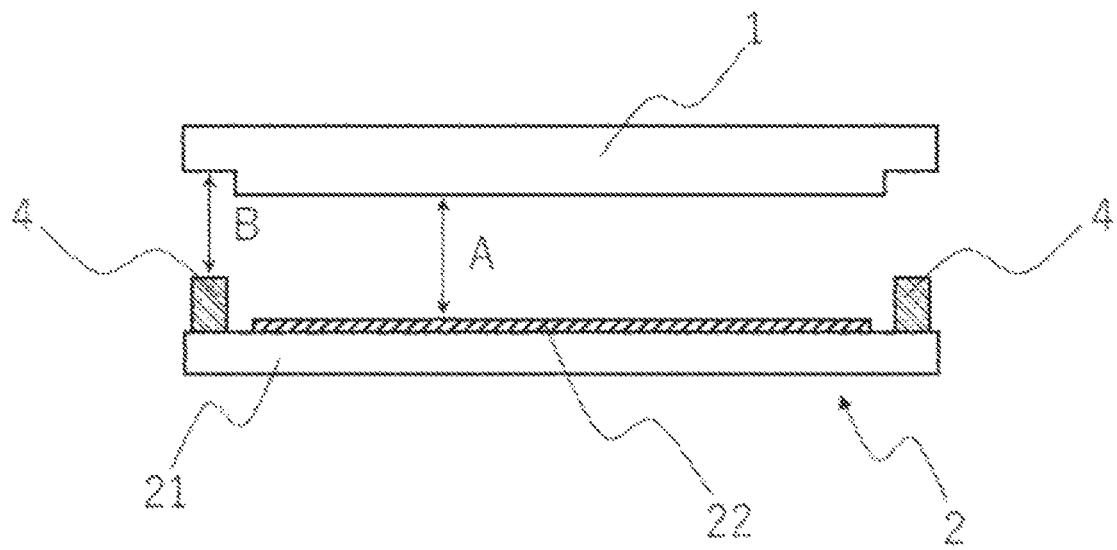
FIG. 5 is a partial end surface diagram illustrating another sealing material placing step according to the present disclosure.

The sealing material placing step is to place the sealing material 4 to either one of or both of the mold 1 and the object 2 subjected to pattern formation so as to surround the to-be-molded surface 25 of the object 2 subjected to pattern formation when the mold 1 and the object 2 subjected to pattern formation are attached to each other. FIGS. 1 and 2 illustrate a case in which the sealing material 4 is placed on the object 2 subjected to pattern formation. Moreover, FIG. 3 illustrates a case in which it is placed on the mold 1. Furthermore, FIG. 4 illustrates a case in which the sealing materials 4 are placed on both the mold 1 and the object 2 subjected to pattern formation.

The sealing material 4 can be placed in any way as far as it does not affect the to-be-molded surface in the hermetic sealing step to be described later. For example, in view of the costs of the sealing material 4, it is preferable so as to surround at the shortest distance. Moreover, it may be surrounded with a clearance for cutting a portion where the sealing material 4 is placed relative to the to-be-molded surface 25.

Furthermore, the sealing material 4 is placed with a thickness that can surely gas-tightly seal a space between the mold 1 and the object 2 subjected to pattern formation in the hermetic sealing step to be described later. More specifically, as illustrated in FIG. 2 to FIG. 5, it is preferable that, when the mold 1 and the object 2 subjected to pattern formation are made in parallel with each other, a distance B obtained by subtracting the thickness of the sealing material 4 from the distance between the mold 1 and the object 2 subjected to pattern formation (the substrate 21) at the location where the sealing material 4 is placed becomes equal to or smaller than a distance A between the molding surface of the mold 1 and the to-be-molded surface of the object 2 subjected to pattern formation. According to such a structure, in the hermetic sealing step to be described later, the sealing material 4 can be surely in contact with the mold 1 and the object 2 subjected to pattern formation, thereby gas-tightly sealing a space therebetween (see FIGS. 6 and 7).

The pressure reducing step is to reduce the pressure of the atmosphere around the mold 1 and the object 2 subjected to pattern formation so as to eliminate a gas between the mold 1 and the object 2 subjected to pattern formation which causes gas bubbles at the time of attachment with the mold 1 and the object 2 subjected to pattern formation being separated from each other. Such a pressure reduction is to be equal to or smaller than a pressure that does not cause at least a transfer failure by the remaining gas when the molding pattern of the mold 1 is transferred to the object 2 subjected to pattern formation. This depends on the material of the object 2 subjected to pattern formation, but it may be equal to or smaller than 50 Pa, preferably, equal to or smaller than 10 Pa, for example. As far as the pressure of the atmosphere around the mold 1 and the object 2 subjected to pattern formation can be reduced, the pressure reducing method is not limited to any particular one, but for example, degassing of a gas in a vacuum chamber in which the mold 1 and the object 2 subjected to pattern formation are placed by a vacuum pump etc., is applicable.

Figure 6:
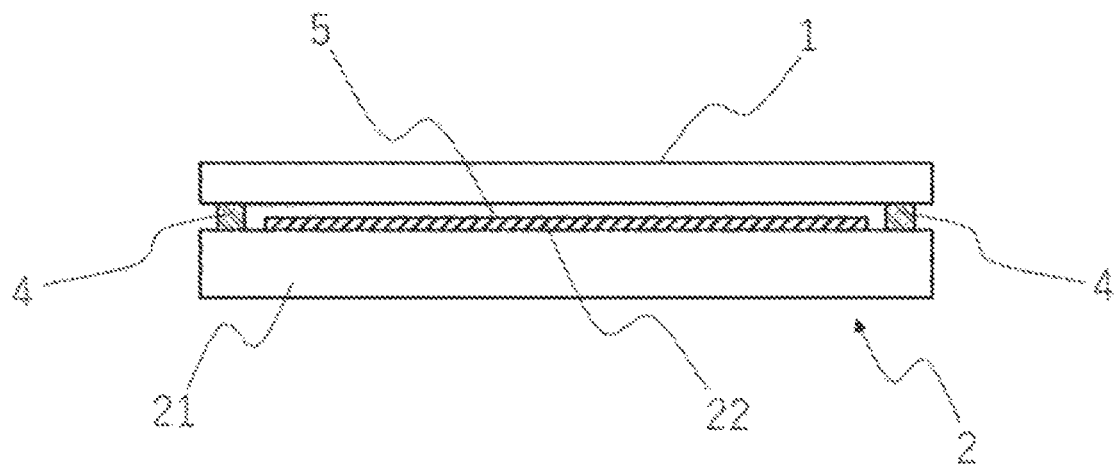
FIG. 6 is a partial end surface diagram illustrating a hermetic sealing step according to the present disclosure.
Figure 7:
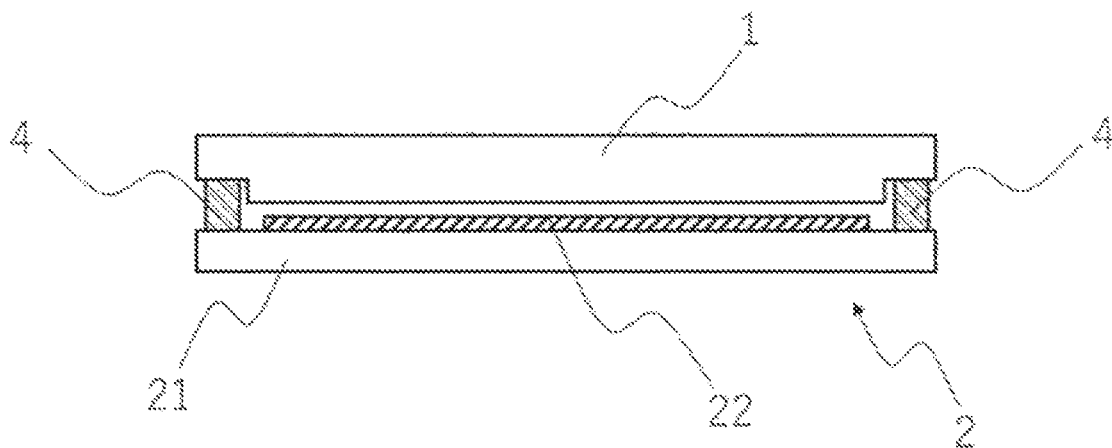
FIG. 7 is a partial end surface diagram illustrating another hermetic sealing step according to the present disclosure.

As illustrated in FIGS. 6 and 7, the hermetic sealing step is to cause the mold 1 and the object 2 subjected to pattern formation to be laid over with each other, and to gas-tightly seal the space between the mold 1 and the object 2 subjected to pattern formation by the sealing material 4. This enables the mold 1, the object 2 subjected to pattern formation and the sealing material 4 to form a closed space 5. Note that the molding surface 15 of the mold 1 and the to-be-molded surface 25 of the object 2 subjected to pattern formation may be in contact with each other.

Figure 8:
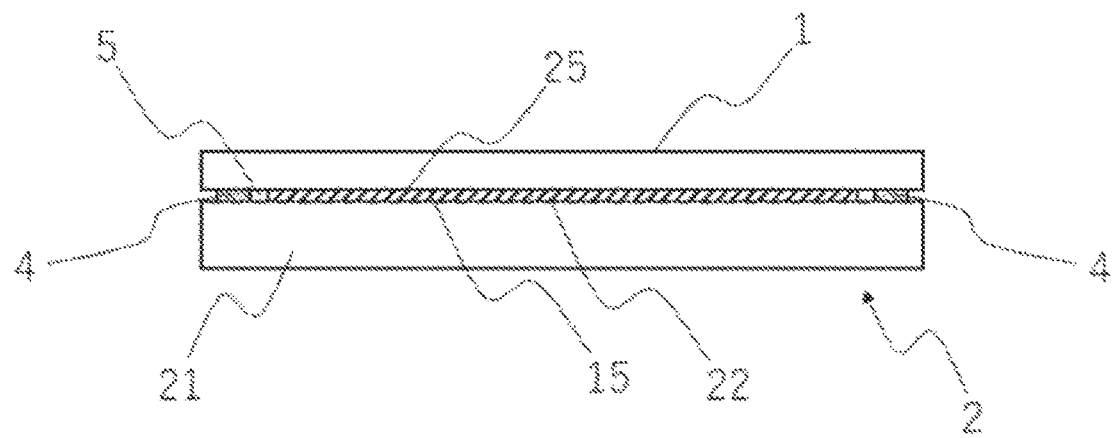
FIG. 8 is a partial end surface diagram illustrating an attached body according to the present disclosure.

As illustrated in FIG. 8, the first pressurizing step is to pressurize by fluid with the space between the mold 1 and the object 2 subjected to pattern formation being gas-tightly sealed. This enables the mold 1 and the object 2 subjected to pattern formation to be attached to each other without any gas bubble. The first pressurizing step may have a pressure that is higher than a pressure in the closed space 5 formed by the mold 1, the object 2 subjected to pattern formation, and the sealing material 4, and may have any pressure that can cause the mold 1 and the object 2 subjected to pattern formation to be intimately in contact with each other, and for example, an atmospheric pressure may adopted.

Moreover, according to the attached body production method of the present disclosure, the above-described sealing material 4 applied is a material that has a fluidity at least in the hermetic sealing step. Hence, even if the surface of the mold 1 and that of the object 2 subjected to pattern formation have concavities and convexities, etc., the flowage can surely accomplish a gas-tight sealing. Example sealing materials applicable are a photo-curing resin and a thermo-setting resin. Furthermore, as far as it can function as the sealing material, the same material as that of the object subjected to pattern formation may be applied.

Still further, the sealing material 4 is configured to be adhered to only either the mold 1 or the object 2 subjected to pattern formation at the time of demolding between the mold 1 and the object 2 subjected to pattern formation. Hence, after the demolding between the mold 1 and the object 2 subjected to pattern formation, the sealing material 4 can be easily removed. For example, the sealing material 4 may be configured to be adhered to the object 2 subjected to pattern formation at the time of demolding, and the portion of the object 2 subjected to pattern formation to which the sealing material 4 is adhered may be removed by dicing. When there is a step of performing dicing on the object 2 subjected to pattern formation in the steps after demolding, such a removal can be simultaneously performed with the dicing step.

The sealing material 4 may be formed of a material which is configured to be adhered to only the object 2 subjected to pattern formation when demolding between the mold 1 and the object 2 subjected to pattern formation is performed, and which is removable by etching on the to-be-molded surface 25. This enables the removal of the sealing material 4 simultaneously with the etching, thereby simplifying the steps.

An example scheme to cause the sealing material 4 to be adhered to only either one of the mold 1 or the object 2 subjected to pattern formation at the time of demolding between the mold 1 and the object 2 subjected to pattern formation is to increase the adhesion strength of the component to which the sealing material 4 is adhered relative to the adhesion strength of the component to which it is not adhered. Needless to say, the adhesion strength of the component to which the sealing material 4 is not adhered is set to be smaller than force that breaks the sealing material 4.

For example, prior to the sealing material placing step, a first surface processing step of forming a first surface processed portion that increases adhesion strength with the sealing material 4 may be performed on either one of the mold 1 or the object 2 subjected to pattern formation. The first surface processed portion may chemically increase the adhesion strength, or may physically increase the adhesion strength.

In this case, an example first surface processed portion applicable is a primer that increases the adhesion strength between the sealing material 4 and the mold 1 or the object 2 subjected to pattern formation. Moreover, as the first surface processed portion, plasma treatment or corona treatment may be performed which increases the adhesion strength between the sealing material 4 and the mold 1 or the object 2 subjected to pattern formation. Furthermore, as the first surface processed portion, concavities and convexities may be formed which increases the adhesion strength between the sealing material 4 and the mold 1 or the object 2 subjected to pattern formation. Needless to say, a combination of the above-schemes that are equal to or greater than two is also applicable.

Moreover, prior to the sealing material placing step, a second surface processing step of forming a second surface processed portion that decreases the adhesion strength with the sealing material 4 may be performed on either one of the mold 1 or the object 2 subjected to pattern formation. In this case, as an example second surface processed portion, a demolding agent may be applied.

As described above, the sealing material 4 may be removed by dicing, etc., but a material that can be easily removed after the demolding may be applied. For example, a material may be applied which is configured to be adhered to only the object 2 subjected to pattern formation at the time of demolding between the mold 1 and the object 2 subjected to pattern formation, and which is removable by etching performed on the to-be-molded surface 25. This enables the removal of the sealing material 4 simultaneously with the etching on the object 2 subjected to pattern formation.

Furthermore, the sealing material 4 may be a water-soluble resin. This facilitates cleansing.

Still further, a material that decreases the adhesion strength by emission of light thereto with a predetermined wavelength may be applied to the sealing material 4. In this case, when the predetermined wavelength differs from the wavelength of light applied in optical imprinting, after the pattern transfer by the optical imprinting is surely performed, the light with the predetermined wavelength may be emitted to the sealing material 4 so as to remove the sealing material 4. Moreover, when the above-described predetermined wavelength is the same as the wavelength of light applied in the optical imprinting, the adhesion strength of the sealing material 4 can be reduced simultaneously with the light emission by the optical imprinting.

Next, an attached body according to the present disclosure will be described with reference to FIG. 8. The attached body according to the present disclosure is an attached body of the mold 1 that has the molding surface 15, and the object 2 subjected to pattern formation that has the to-be-molded surface 25 attached to the molding surface 15, and includes the sealing material 4 that adheres the mold 1 and the object 2 subjected to pattern formation to each other so as to surround the to-be-molded surface 25. Moreover, the sealing material 4 is configured to be adhered to only either one of the mold 1 or the object 2 subjected to pattern formation at the time of demolding between the mold 1 and the object 2 subjected to pattern formation. Note that the same portion as the portion described in the above-described attached body production method according to the present disclosure will be denoted by the same reference numeral, and the duplicated description thereof will be omitted.

As described for the attached body production method according to the present disclosure, either one of the mold 1 or the object 2 subjected to pattern formation may have the first surface processed portion that increases the adhesion strength with the sealing material 4. In this case, an example first surface processed portion applicable is a primer that increases the adhesion strength between the sealing material 4 and the mold 1 or the object 2 subjected to pattern formation. Moreover, the first surface processed portion may be a surface having undergone a plasma treatment or a corona treatment which increases the adhesion strength between the sealing material 4 and the mold 1 or the object 2 subjected to pattern formation. Furthermore, the first surface processed portion may be concavities and convexities that increase the adhesion strength between the sealing material 4 and the mold 1 or the object 2 subjected to pattern formation.

Still further, as described for the attached body production method according to the present disclosure, either one of the mold 1 and the object 2 subjected to pattern formation may have the second surface processed portion that decreases the adhesion strength with the sealing material 4. In this case, an example second surface processed portion applicable is a demolding agent.

Moreover, a material that can be easily removed after the demolding may be applied to the sealing material 4. For example, a material may be applied which is configured to be adhered to only the object 2 subjected to pattern formation at the time of demolding between the mold 1 and the object 2 subjected to pattern formation, and which is removable by etching performed on the to-be-molded surface 25. Furthermore, the sealing material 4 may be a water-soluble resin. Still further, the sealing material 4 may be a material that decreases the adhesion strength by emission of light thereto with a predetermined wavelength.

Figure 9:
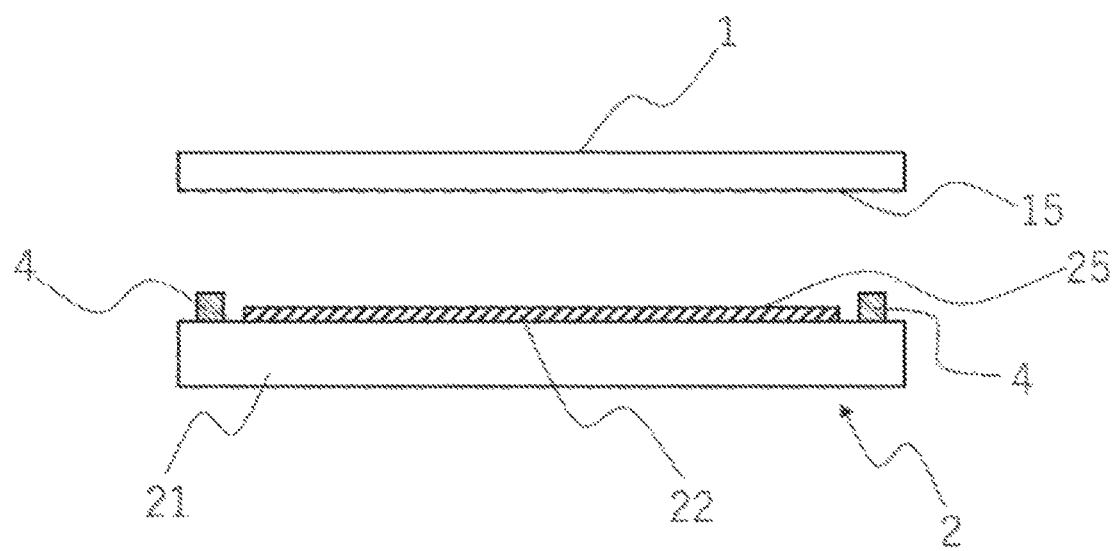
FIG. 9 is a partial end surface diagram illustrating a demolding step according to the present disclosure.
Figure 10:
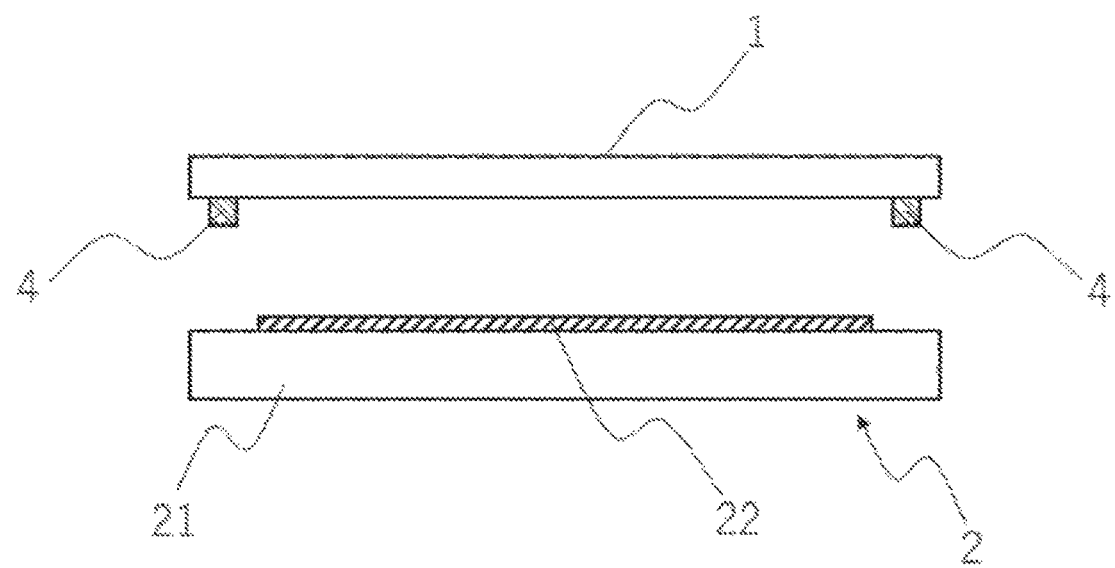
FIG. 10 is a partial end surface diagram illustrating another demolding step according to the present disclosure.

Next, a microstructure formation method according to the present disclosure will be described. The microstructure formation method according to the present disclosure is to form a microstructure on the object 2 subjected to pattern formation, and includes a demolding step of demolding the mold 1 from at least the object 2 subjected to pattern formation of the above-described attached body according to the present disclosure. According to the demolding step, as illustrated in FIG. 9, demolding is performed in such a way that the sealing material 4 is adhered to only the object 2 subjected to pattern formation, or as illustrated in FIG. 10, the demolding is performed in such a way that the sealing material 4 is adhered to only the mold 1. Regarding the demolding method, a conventionally-well known method may be applied.

Moreover, the microstructure formation method according to the present disclosure may include a second pressurizing step of pressurizing the attached body by fluid at larger pressure than an atmospheric pressure prior to the demolding step. This ensures the transfer of the pattern of the mold 1 to the object 2 subjected to pattern formation. Note that when the pattern of the mold 1 is transferred to the object 2 subjected to pattern formation by the first pressurizing step of the above-described attached body production method, the second pressurizing step may be omitted.

Furthermore, when the microstructure formation method according to the present disclosure is applied to the optical imprinting, a light emitting step of emitting light to the attached body to cause the object 2 subjected to pattern formation to be cured is applied. In this case, the emitted light have a wavelength that can cure the object 2 subjected to pattern formation.

Figure 11:
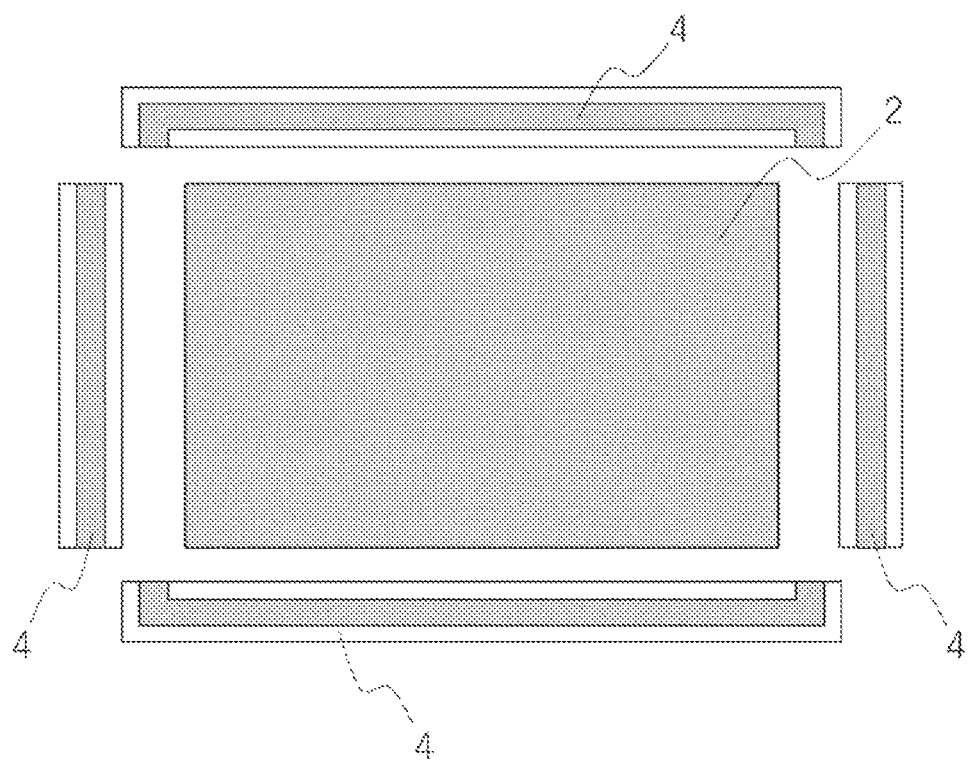
FIG. 11 is a partial end surface diagram illustrating a sealing material removing step according to the present disclosure.

A sealing material removing step is to remove the sealing material 4 from the mold 1 or from the object 2 subjected to pattern formation. For example, the sealing material 4 is configured to be adhered to the object 2 subjected to pattern formation at the time of demolding, and after the demolding, as illustrated in FIG. 11, the portion to which the sealing material 4 is adhered may be removed from the object 2 subjected to pattern formation by dicing. When there is a step of performing dicing on the object 2 subjected to pattern formation in the steps after the demolding, such a removal can be performed simultaneously in the dicing step. Moreover, the sealing material removing step may be to dissolve the sealing material 4 to remove such a material. In this case, when the sealing material 4 is a water-soluble resin, cleansing for the sealing material 4 can be easily performed by water. Furthermore, the sealing material removing step may be to remove such a material from the object 2 subjected to pattern formation by etching performed on the to-be-molded surface 25. When there is a step of performing etching on the object 2 subjected to pattern formation in the steps after the demolding, such a removal can be performed simultaneously with etching.

Still further, when the sealing material 4 is a material that decreases the adhesion strength by emission of light thereto with a predetermined wavelength, regarding the sealing material removing step, after light with the predetermined wavelength is emitted to the sealing material 4 to decrease the adhesion strength, such a material can be removed.

REFERENCE SIGNS LIST

1 Mold
2 Object subjected to pattern formation
4 Sealing material
5 Closed space
21 Substrate
22 Layer subjected to pattern formation

What is claimed is:

1. A production method for an attached body of a mold and an object subjected to pattern formation, the method comprising:
    a sealing material placing step of placing a sealing material on either one of or both of a mold and an object subjected to pattern formation so as to surround a to-be-molded surface of the object subjected to pattern formation when the mold and the object subjected to pattern formation are attached to each other;
    a pressure reducing step of reducing an atmospheric pressure around the mold and the object subjected to pattern formation with the mold and the object subjected to pattern formation being separated from each other;
    a hermetic sealing step of causing the mold and the object subjected to pattern formation to be laid over with each other, and of gas-tightly sealing a space between the mold and the object subjected to pattern formation by the sealing material; and
    a first pressurizing step of pressurizing by fluid with the space between the mold and the object subjected to pattern formation being gas-tightly sealed,
    wherein the sealing material is configured to have a fluidity in at least the hermetic sealing step, and to be adhered to only either one of the mold or the object subjected to pattern formation at a time of demolding between the mold and the object subjected to pattern formation.

2. The attached body production method according to claim 1, further comprising the step of, prior to the sealing material placing step, a first surface processing step of forming a first surface processed portion on either one of the mold or the object subjected to pattern formation, the first surface processed portion increasing adhesion strength with the sealing material.

3. The attached body production method according to claim 2, wherein the first surface processed portion is a primer that increases the adhesion strength between the sealing material and the mold or the object subjected to pattern formation.

4. The attached body production method according to claim 2, wherein the first surface processed portion is a surface having undergone a plasma treatment or a corona treatment that increases the adhesion strength between the sealing material and the mold or the object subjected to pattern formation.

5. The attached body production method according to claim 2, wherein the first surface processed portion is formed by concavities and convexities that increase the adhesion strength between the sealing material and the mold or the object subjected to pattern formation.

6. The attached body production method according to claim 2, further comprising the step of, prior to the sealing material placing step, a second surface processing step of forming a second surface processed portion on either one of the mold or the object subjected to pattern formation, the second surface processed portion decreasing adhesion strength with the sealing material.

7. The attached body production method according to claim 1, wherein the sealing material is formed of a material which is configured to be adhered to only the object subjected to pattern formation at the time of demolding between the mold and the object subjected to pattern formation, and which is removable by etching performed on the to-be-molded surface.

8. The attached body production method according to claim 1, wherein the sealing material is a water-soluble resin.

9. The attached body production method according to claim 1, wherein the sealing material is formed of a material that decreases adhesion strength by emission of light thereto.

10. The attached body production method according to claim 1, wherein when the mold and the object subjected to pattern formation are made in parallel with each other, in the sealing material placing step, the placement is performed in such a way that a distance obtained by subtracting a thickness of the sealing material from a distance between the mold and the object subjected to pattern formation at a location where the sealing material is placed becomes equal to or shorter than a distance between the mold and the to-be-molded surface of the object subjected to pattern formation.

11. The attached body production method according to claim 1, wherein in the first pressurizing step, the pressurization is performed at an atmospheric pressure.

* * * * *